(12) United States Patent
Matsushima et al.

(10) Patent No.: US 9,845,999 B2
(45) Date of Patent: Dec. 19, 2017

(54) LIQUID-COOLED-TYPE COOLING DEVICE AND MANUFACTURING METHOD FOR SAME

(71) Applicant: SHOWA DENKO K.K., Tokyo (JP)

(72) Inventors: Seiji Matsushima, Oyama (JP); Kouji Tomita, Oyama (JP)

(73) Assignee: SHOWA DENKO K.K., Tokyo (JP)

( * ) Notice: Subject to any disclaimer, the term of this patent is extended or adjusted under 35 U.S.C. 154(b) by 335 days.

(21) Appl. No.: 13/670,809

(22) Filed: Nov. 7, 2012

(65) Prior Publication Data
US 2013/0284404 A1 Oct. 31, 2013

(30) Foreign Application Priority Data

Nov. 11, 2011 (JP) .................................. 2011-247599
Oct. 26, 2012 (JP) .................................. 2012-236538

(51) Int. Cl.
*F28F 3/12* (2006.01)
*F28F 1/40* (2006.01)
(Continued)

(52) U.S. Cl.
CPC ................. *F28F 1/40* (2013.01); *B23P 11/00* (2013.01); *B23P 15/26* (2013.01); *F28F 3/022* (2013.01);
(Continued)

(58) Field of Classification Search
CPC .... H05K 7/20; F28D 15/00; F28F 7/00; F28F 3/12; F28F 7/02; F28F 3/14; B21D 53/022; Y10T 29/49359; H01L 2924/0002
(Continued)

(56) References Cited

U.S. PATENT DOCUMENTS 2,343,049 A * 2/1944 Fassinger, Sr. ............... 165/154
3,334,925 A * 8/1967 Jayne ...................... F16L 13/08
174/84 R
(Continued)

FOREIGN PATENT DOCUMENTS

JP 2009-277768 A 11/2009

OTHER PUBLICATIONS

How to Braze Properly Proper Brazing Procedure Retrieved from the Internet http://www.lucasmilhaupt.com/en-US/brazingfundamentals/properbrazingprocedure/.*
(Continued)

*Primary Examiner* — Len Tran
*Assistant Examiner* — Gustavo Hincapie Serna
(74) *Attorney, Agent, or Firm* — Mori & Ward, LLP

(57) ABSTRACT

A liquid-cooled-type cooling device includes a casing having a top wall, a bottom wall, and a cooling-liquid passage, and a radiating member disposed in the cooling-liquid passage. The radiating member has a substrate and a plurality of pin-shaped fins. Longitudinally intermediate portions of the pin-shaped fins are brazed to the substrate. The substrate has a plurality of fin insertion holes, and the pin-shaped fins are inserted into the fin insertion holes of the substrate. A plurality of convex portions are integrally formed on the longitudinally intermediate portion of each pin-shaped fin. The substrate and the pin-shaped fins are provisionally fixed together by plastically deforming the convex portions such that they are crushed. In this state, the substrate and the pin-shaped fins are brazed together. The upper and lower end portions of the pin-shaped fins are brazed to the top wall and bottom wall, respectively, of the casing.

7 Claims, 4 Drawing Sheets

(51) Int. Cl.
*B23P 15/26* (2006.01)
*H01L 23/473* (2006.01)
*B23P 11/00* (2006.01)
*F28F 3/02* (2006.01)
*F28F 21/08* (2006.01)

(52) U.S. Cl.
CPC .............. *F28F 3/12* (2013.01); *F28F 21/084* (2013.01); *H01L 23/473* (2013.01); *F28F 2275/04* (2013.01); *F28F 2275/12* (2013.01); *H01L 2924/0002* (2013.01); *Y10T 29/4935* (2015.01)

(58) Field of Classification Search
USPC .................... 165/104.19, 80.4, 170; 361/699
See application file for complete search history.

(56) References Cited

U.S. PATENT DOCUMENTS

| | | | | |
|---|---|---|---|---|
| 3,703,895 A * | 11/1972 | Wiberg | .............. | B60H 1/00364 126/116 R |
| 4,741,100 A * | 5/1988 | Pierson | .................... | 29/845 |
| 4,741,392 A * | 5/1988 | Morse | .................... | F28F 9/262 165/144 |
| 5,499,450 A * | 3/1996 | Jacoby | .................... | F28F 3/022 165/185 |
| 5,978,220 A * | 11/1999 | Frey | .................... | H01L 23/473 165/80.4 |
| 6,065,530 A * | 5/2000 | Austin et al. | ................. | 165/80.3 |
| 6,591,897 B1 * | 7/2003 | Bhatti | .................... | H01L 23/3677 165/185 |
| 6,655,449 B1 * | 12/2003 | Hsien | .................... | 165/80.4 |
| 6,840,308 B2 * | 1/2005 | Ritter et al. | ................. | 165/80.4 |
| 6,956,740 B2 * | 10/2005 | Shimura et al. | .............. | 361/700 |
| 7,173,823 B1 * | 2/2007 | Rinehart | ............... | F28D 9/0031 165/80.4 |
| 7,661,276 B1 * | 2/2010 | Cruzan et al. | .................. | 62/515 |
| 7,764,494 B2 * | 7/2010 | Balzano | ................. | H01L 23/473 165/104.22 |
| 7,898,809 B2 * | 3/2011 | Li | ....................... | H01L 21/4882 165/185 |
| 2002/0004324 A1 * | 1/2002 | Saiki et al. | ..................... | 439/83 |
| 2002/0185260 A1 * | 12/2002 | Calaman et al. | ............ | 165/80.4 |
| 2003/0151130 A1 * | 8/2003 | Cheon | ....................... | F28F 3/12 257/712 |
| 2004/0182544 A1 * | 9/2004 | Lee et al. | ...................... | 165/80.4 |
| 2005/0178528 A1 * | 8/2005 | Ohashi | ................. | F28D 1/05333 165/80.3 |
| 2006/0076122 A1 * | 4/2006 | Huang et al. | ................. | 165/80.4 |
| 2006/0162899 A1 * | 7/2006 | Huang et al. | ................. | 165/80.4 |
| 2006/0191675 A1 * | 8/2006 | Fletcher et al. | .............. | 165/172 |
| 2006/0289987 A1 * | 12/2006 | Chiu | .................... | H01L 23/473 257/714 |
| 2007/0107874 A1 * | 5/2007 | Peng | ........................... | 165/80.4 |
| 2007/0119572 A1 * | 5/2007 | Weber et al. | ................ | 165/80.4 |
| 2007/0209784 A1 * | 9/2007 | Peng | ........................... | 165/120 |
| 2007/0227697 A1 * | 10/2007 | Takahashi | .................... | 165/80.4 |
| 2008/0000618 A1 * | 1/2008 | Liang | .......................... | 165/80.3 |
| 2009/0065178 A1 * | 3/2009 | Kasezawa | ............. | H01L 23/473 165/104.19 |
| 2009/0101322 A1 * | 4/2009 | Hahmann | ............ | F28F 21/065 165/168 |
| 2009/0114372 A1 * | 5/2009 | Ippoushi et al. | ......... | 165/104.14 |
| 2010/0157532 A1 * | 6/2010 | Nguyen | .................. | H01G 2/08 361/697 |
| 2010/0172091 A1 * | 7/2010 | Nishiura | ....................... | 361/689 |
| 2010/0243207 A1 * | 9/2010 | Liu et al. | ...................... | 165/80.3 |
| 2011/0133026 A1 * | 6/2011 | Behrens et al. | .......... | 244/117 A |

OTHER PUBLICATIONS

Brazing Aluminum to Copper Blog HVAC Joining Aluminum to Copper Apr. 26, 2012 Retrieved from the Internet http://www.lucasmilhaupt.com/en-US/about/blog/2012/4/HAVCjoiningaluminumtocopper.*

* cited by examiner

LIQUID-COOLED-TYPE COOLING DEVICE AND MANUFACTURING METHOD FOR SAME

BACKGROUND OF THE INVENTION

The present invention relates to a liquid-cooled-type cooling device for cooling a heat-generating body composed of an electronic component such as a semiconductor device, and to a method of manufacturing the same.

The present applicant has proposed a liquid-cooled-type cooling device for cooling a power device (semiconductor device), such as IGBT (Insulated Gate Bipolar Transistor), which is used in a power conversion apparatus mounted on an electric vehicle, a hybrid vehicle, an electric railcar, or the like (see Japanese Patent Application Laid-Open (kokai) No. 2009-277768). The proposed liquid-cooled-type cooling device includes a casing having a cooling-liquid passage through which cooling liquid, including water (e.g., long life coolant) flows, and a radiating member fitted into an opening formed in the top wall of the casing. The radiating member is composed of a substrate whose first surface faces the cooling-liquid passage and whose second surface serves as a heat-generating body mount surface, and a plurality of pin-shaped fins integrally formed on the first surface of the substrate through forging such that the fins are staggered. A gap is provided between the distal ends of the pin-shaped fins and the bottom wall of the casing.

However, in the case of the liquid-cooled-type cooling device disclosed in the publication, since the pin-shaped fins of the radiating member are integrally formed on the substrate through forging, their dimensional accuracy in the height direction is insufficient. Therefore, the pin-shaped fins cannot be made uniform in height. Also, since the height of the pin-shaped fins is affected by the thickness of the substrate before formation of the pin-shaped fins, in order to secure a height of the pin-shaped fins sufficient for attaining a required heat radiation performance, the thickness of the substrate before formation of the pin-shaped fins must be increased. In such a case, after formation of the pin-shaped fins, the substrate has a relatively large thickness, which lowers the transfer of heat from a heat-generating body attached to the second surface to the pin-shaped fins, whereby the heat radiation performance becomes insufficient. The above-described problem of the liquid-cooled-type cooling device disclosed in the publication can be solved by machining the pin-shaped fins formed on the first surface of the substrate through forging, so as to make the pin-shaped fins uniform in height, and machining the substrate to thereby decrease the thickness of the substrate. However, in this case, the number of man-hours required for manufacturing the liquid-cooled-type cooling device increases. In addition, since the distal ends of the pin-shaped fins are not joined to the bottom wall, when the thickness of the substrate is decreased, the withstanding pressure of the liquid-cooled-type cooling device may become insufficient.

SUMMARY OF THE INVENTION

An object of the present invention is to solve the above-mentioned problem and to provide a liquid-cooled-type cooling device which can improve heat radiation performance and can suppress an increase in the number of man-hours required for manufacturing the liquid-cooled-type cooling device, and a method of manufacturing the same.

To achieve the above object, the present invention comprises the following modes.

1) A liquid-cooled-type cooling device comprising a casing which has a top wall and a bottom wall and in which a cooling-liquid passage is provided; and a radiating member disposed in the cooling-liquid passage within the casing, wherein the radiating member is composed of a substrate and a plurality of pin-shaped fins which are oriented such that their longitudinal direction coincides with a vertical direction and whose longitudinally intermediate portions are brazed to the substrate; a plurality of fin insertion holes are formed in the substrate; the pin-shaped fins are inserted into the fin insertion holes of the substrate; the pin-shaped fins and the substrate are brazed together in a state in which the pin-shaped fins and the substrate are provisionally fixed by plastic deformation of at least the pin-shaped fins or portions of the substrate around the fin insertion holes; and upper and lower end portions of the pin-shaped fins are brazed to the top wall and bottom wall, respectively, of the casing.

2) A liquid-cooled-type cooling device according to par. 1), wherein a convex portion is integrally provided on the longitudinally intermediate portion of each pin-shaped fin such that the convex portion projects outward from the peripheral surface of the longitudinally intermediate portion; the substrate is harder than the pin-shaped fins; and of the convex portion and the portions of the substrate around the fin insertion holes, at least the convex portion is plastically deformed such that the convex portion is crushed.

3) A liquid-cooled-type cooling device according to par. 1), wherein a convex portion is integrally provided on the longitudinally intermediate portion of each pin-shaped fin such that the convex portion projects outward from the peripheral surface of the longitudinally intermediate portion; the pin-shaped fins are harder than the substrate; and of the convex portion and the portions of the substrate around the fin insertion holes, at least the portions of the substrate around the fin insertion holes are plastically deformed.

4) A liquid-cooled-type cooling device according to par. 2) or 3), wherein a portion of each pin-shaped fin where the convex portion is not provided has a circular transverse cross section; and convex portions and concave portions are formed on the longitudinally intermediate portion of each pin-shaped fin alternately and continuously in the circumferential direction such that the convex portions project radially outward from the peripheral surface of the intermediate portion, and the concave portions descend radially inward from the peripheral surface of the intermediate portion.

5) A liquid-cooled-type cooling device according to par. 4), wherein the fin insertion holes of the substrate are circular and have a diameter of 0.5 to 6 mm; a portion of each pin-shaped fin where neither the convex portions nor the concave portions are provided has a diameter of 0.3 to 5.99 mm; and the concave portions have a depth of 0.05 to 0.6 mm.

6) A liquid-cooled-type cooling device according to par. 1), wherein the portions of the substrate around the fin insertion holes are plastically deformed by being pressed from opposite sides of the substrate.

7) A method of manufacturing a liquid-cooled-type cooling device according to par. 2), comprising preparing members which constitute a casing having a top wall, a bottom wall, and a cooling-liquid passage provided therein, a substrate having a plurality of fin insertion holes, a plurality of pin-shaped fins each having a plurality of convex portions provided on a longitudinally intermediate portion of the peripheral surface such that the convex portions project outward from the peripheral surface, wherein an imaginary shape formed by connecting projecting ends of the plurality of convex portions of each pin-shaped fin is greater in size than the fin insertion holes of the substrate, and the substrate is harder than the pin-shaped fins; press-fitting the pin-shaped fins into the fin insertion holes of the substrate so as to plastically deform at least the convex portions of the pin-shaped fins, of the convex portions of the pin-shaped fins and portions of the substrate around the pin insertion holes, to thereby provisionally fix the pin-shaped fins to the substrate; and combining the substrate and the pin-shaped fins provisionally fixed to the substrate with the members constituting the casing, brazing the substrate and the pin-shaped fins together, and simultaneously brazing opposite ends of the pin-shaped fins to portions of the members constituting the casing, which portions are to become the top and bottom walls of the casing.

8) A method of manufacturing a liquid-cooled-type cooling device according to par. 3), comprising preparing members which constitute a casing having a top wall, a bottom wall, and a cooling-liquid passage provided therein, a substrate having a plurality of fin insertion holes, a plurality of pin-shaped fins each having a plurality of convex portions provided on a longitudinally intermediate portion of the peripheral surface such that the convex portions project outward from the peripheral surface, wherein an imaginary shape formed by connecting projecting ends of the plurality of convex portions of each pin-shaped fin is greater in size than the fin insertion holes of the substrate, and the pin-shaped fins are harder than the substrate; press-fitting the pin-shaped fins into the fin insertion holes of the substrate so as to plastically deform at least portions of the substrate around the pin insertion holes, of the convex portions of the pin-shaped fins and the portions of the substrate around the pin insertion holes, to thereby provisionally fix the pin-shaped fins to the substrate; and combining the substrate and the pin-shaped fins provisionally fixed to the substrate with the members constituting the casing, brazing the substrate and the pin-shaped fins together, and simultaneously brazing opposite ends of the pin-shaped fins to portions of the members constituting the casing, which portions are to become the top and bottom walls of the casing.

9) A manufacturing method according to par. 7) or 8), wherein the fin insertion holes of the substrate are circular holes having a diameter of 0.5 to 6 mm; a portion of each pin-shaped fin where the convex portions are not provided has a circular transverse cross section and has a diameter of 0.3 to 5.99 mm; an imaginary shape formed by connecting projecting ends of the plurality of convex portions is a circle having a diameter greater than a diameter of the fin insertion holes of the substrate; the convex portions have a length of 0.5 to 5 mm in the longitudinal direction of the pin-shaped fins; and the diameter A (mm) of each fin insertion hole, the diameter B (mm) of each pin-shaped fin at a portion where the convex portions are not provided, and the diameter C (mm) of the imaginary circle connecting the projecting ends of all the convex portions satisfy relations $A-0.2 \leq B \leq A-0.01$ and $A+0.01 \leq C \leq A+0.2$.

10) A manufacturing method according to par. 7) or 8), wherein a longitudinally intermediate portion of the peripheral surface of a cylindrical columnar fin material is pressed from the radially outer side at a plurality of locations spaced from each other in the circumferential direction, whereby a plurality of concave portion descending from the peripheral surface are formed at predetermined intervals in the circumferential direction, and each of the convex portions is provided between the adjacent concave portions, whereby the pin-shaped fins are formed.

11) A manufacturing method according to par. 10), wherein the concave portions of the pin-shaped fins have a depth of 0.05 to 0.6 mm.

12) A method of manufacturing a liquid-cooled-type cooling device according to par. 6), comprising preparing members which constitute a casing having a top wall, a bottom wall, and a cooling-liquid passage provided therein, a substrate having a plurality of fin insertion holes, a plurality of pin-shaped fins; inserting the pin-shaped fins into the fin insertion holes of the substrate; pressing portions of opposite surfaces of the substrate around the fin insertion holes so as to plastically deform portions of the substrate around the fin insertion holes, to thereby provisionally fix the pin-shaped fins to the substrate; and combining the substrate and the pin-shaped fins provisionally fixed to the substrate with the members constituting the casing, brazing the substrate and the pin-shaped fins together, and simultaneously brazing opposite ends of the pin-shaped fins to portions of the members constituting the casing, which portions are to become the top and bottom walls of the casing.

The liquid-cooled-type cooling device of any one of pars. 1) to 6) comprises a casing which has a top wall and a bottom wall and in which a cooling-liquid passage is provided; and a radiating member disposed in the cooling-liquid passage within the casing. The radiating member is composed of a substrate and a plurality of pin-shaped fins which are oriented such that their longitudinal direction coincides with a vertical direction and whose longitudinally intermediate portions are brazed to the substrate. A plurality of fin insertion holes are formed in the substrate. The pin-shaped fins are inserted into the fin insertion holes of the substrate. The pin-shaped fins and the substrate are brazed together in a state in which the pin-shaped fins and the substrate are provisionally fixed by plastic deformation of at least the pin-shaped fins or portions of the substrate around the fin insertion holes. Upper and lower end portions of the pin-shaped fins are brazed to the top wall and bottom wall, respectively, of the casing. Therefore, the pin-shaped fins can be formed separately from the substrate, and the dimensional accuracy of the pin-shaped fins is improved, whereby the heights of the pin-shaped fins can be made uniform. Also, since the upper and lower end portions of the pin-shaped fins are brazed to the top and bottom walls of the casing, the following advantageous effect is attained. In the case where a heat-generating body is attached to the outer surface of at least one of the top and bottom walls of the casing, of the top and bottom walls, the wall to which the heat-generating body is attached can be made thin as compared with the substrate of the heat sink of the liquid-cooled-type cooling device disclosed in Japanese Patent Application Laid-Open No. 2009-277768, whereby transfer of heat between the heat-generating body and the pin-shaped fins is improved. Accordingly, the liquid-cooled-type cooling device has an enhanced heat radiation performance. In addition, since the upper and lower end portions of the pin-shaped fins are brazed to the top and bottom walls of the casing, even in the case where the top or bottom wall to which the heat-generating body is attached is made thinner than the substrate of the heat sink of the liquid-cooled-type cooling device disclosed in the publication, the liquid-cooled-type cooling device has an increased withstanding pressure.

According to the method of manufacturing a liquid-cooled-type cooling device of any one of pars. 7) to 12), since the pin-shaped fins can be formed separately from the substrate and the dimensional accuracy of the pin-shaped fins is improved, the heights of the pin-shaped fins in a manufactured liquid-cooled-type cooling device can be made uniform. Also, since the upper and lower end portions of the pin-shaped fins are brazed to the top and bottom walls of the casing in a state in which the pin-shaped fins are provisionally fixed to the substrate, positional shift of the pin-shaped fins at the time of brazing can be prevented. Furthermore, since the upper and lower end portions of the pin-shaped fins are brazed to the top and bottom walls of the casing, the following advantageous effect is attained. In the case where a heat-generating body is attached to the outer surface of at least one of the top and bottom walls of the casing of the manufactured liquid-cooled-type cooling device, of the top and bottom walls, the wall to which the heat-generating body is attached can be made thin as compared with the substrate of the heat sink of the liquid-cooled-type cooling device disclosed in Japanese Patent Application Laid-Open No. 2009-277768, whereby transfer of heat between the heat-generating body and the pin-shaped fins is improved. Accordingly, the liquid-cooled-type cooling device has an enhanced heat radiation performance. In addition, since the upper and lower end portions of the pin-shaped fins are brazed to the top and bottom walls of the casing, even in the case where the top or bottom wall to which the heat-generating body is attached is made thinner than the substrate of the heat sink of the liquid-cooled-type cooling device disclosed in the publication, the manufactured liquid-cooled-type cooling device has an increased withstanding pressure.

DESCRIPTION OF THE PREFERRED EMBODIMENT

An embodiment of the present invention will next be described with reference to the drawings.

In the specification and appended claims, the term "aluminum" encompasses aluminum alloys in addition to pure aluminum.

Figure 1:
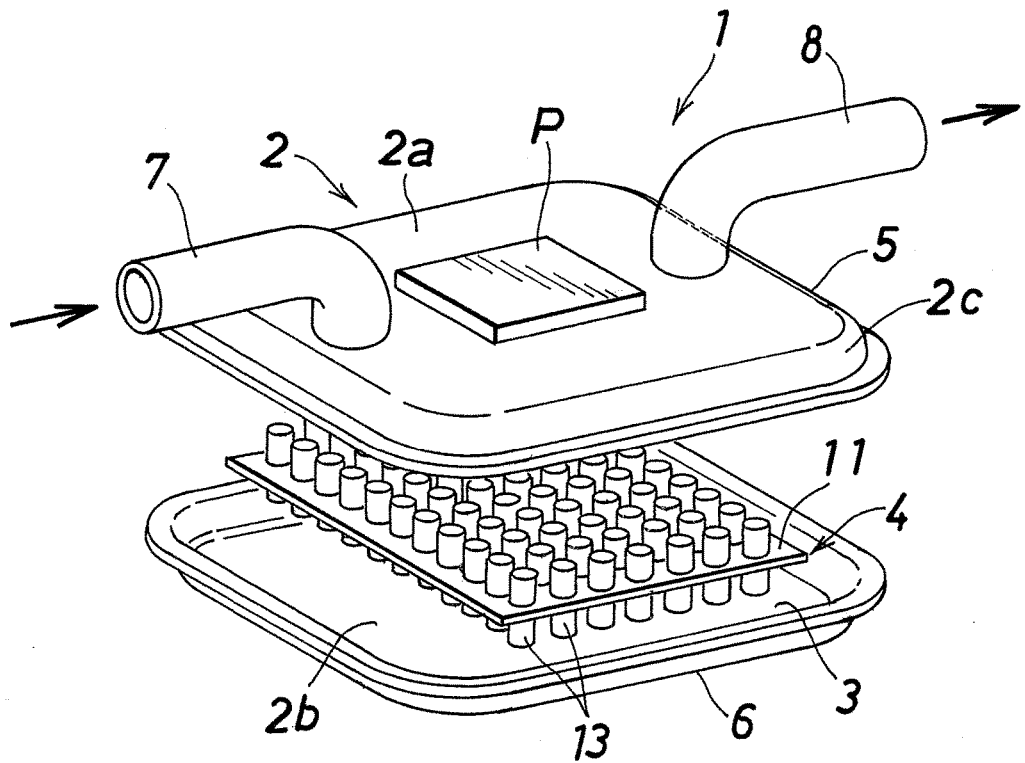
FIG. 1 is an exploded perspective view showing the overall structure of a liquid-cooled-type cooling device according to the present invention.
Figure 2:
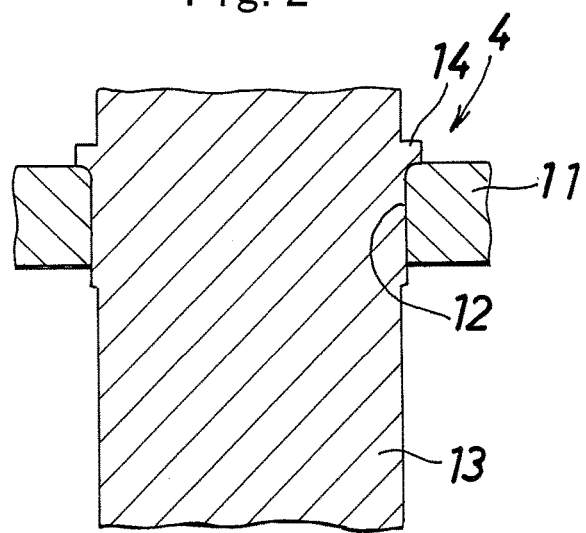
FIG. 2 is a vertical sectional view showing, on an enlarged scale, a main portion of the liquid-cooled-type cooling device of FIG. 1.

FIG. 1 shows the overall structure of a liquid-cooled-type cooling device according to the present invention; and FIG. 2 shows the structure of a main portion of the liquid-cooled-type cooling device.

As shown in FIG. 1, a liquid-cooled-type cooling device 1 includes a hollow casing 2 and a radiating member 4. The casing 2 has a top wall 2a, a bottom wall 2b, and a peripheral wall 2c, and a cooling-liquid passage 3 is provided within the casing 2. The radiating member 4 is disposed in the cooling-liquid passage 3 within the casing 2.

The casing 2 is formed by brazing together an upper constituent member 5 which is made of aluminum and which constitutes the top wall 2a and the upper half of the peripheral wall 2c, and a lower constituent member 6 which is made of aluminum and which constitutes the bottom wall 2b and the lower half of the peripheral wall 2c. An inlet pipe 7 and an outlet pipe 8, which are made of aluminum, are connected to the top wall 2a of the casing 2. The inlet pipe 7 is used to supply a cooling liquid to the cooling-liquid passage 3 within the casing 2. The outlet pipe 8 is used to discharge the cooling liquid from the cooling-liquid passage 3 within the casing 2. A heat-generating body P is attached to at least one of the outer surface of the top wall 2a of the casing 2 and the outer surface of the bottom wall 2b thereof (in the present embodiment, to the outer surface of the top wall 2a). The heat-generating body P may be a power device such as an IGBT, an IGBT module in which an IGBT is integrated with a control circuit and is accommodated in the same package, or an intelligent power module in which an IGBT module is integrated with a protection circuit and is accommodated in the same package.

The radiating member 4 is composed of a substrate 11 made of aluminum and a plurality of pin-shaped fins 13 made of aluminum. As shown in FIG. 2, the substrate 11 has a plurality of circular fin insertion holes (through-holes) 12 extending therethrough. The pin-shaped fins 13 oriented such that their longitudinal direction coincides with the vertical direction are inserted into the fin insertion holes 12, and their intermediate portions in the longitudinal direction (hereinafter referred to as "longitudinally intermediate portions") are brazed to the substrate 11. Each of the pin-shaped fins 13 has the shape of a circular column having a circular transverse cross section. A plurality of convex portions 14 are integrally provided on the longitudinally intermediate portion of each pin-shaped fin 13 at equal intervals in the circumferential direction such that the convex portions 14 project outward from the peripheral surface thereof. The substrate 11 and the pin-shaped fins 13 are brazed together in a state in which the substrate 11 and the pin-shaped fins 13 are provisionally fixed together by plastically deforming the convex portions 14 such that the convex portions 14 are crushed. Also, upper and lower end portions of each pin-shaped fin 13 are brazed to the top wall 2a and the bottom wall 2b, respectively, of the casing 2.

Next, a method of manufacturing the liquid-cooled-type cooling device 1 will be described with reference to FIGS. 3 to 5.

First, the upper and lower constituent members 5 and 6 of the casing 2, and the substrate 11 and the plurality of pin-shaped fins 13 of the radiating member 4 are prepared. The plurality of circular fin insertion holes 12 are formed in the substrate 11 such that they extend through the substrate 11. As shown in FIG. 3, each of the pin-shaped fins 13 has the shape of a circular column having a circular transverse cross section, and a plurality of convex portions 14 are integrally provided on the longitudinally intermediate portion of each pin-shaped fin 13 at equal intervals in the circumferential direction such that the convex portions 14 project outward from the peripheral surface thereof.

In the present embodiment, the aluminum used to form the upper constituent member 5, the lower constituent member 6, the substrate 11, and the pin-shaped fins 13 has a Vickers hardness of 10 to 250, and, preferably, the substrate 11 is made harder than the pin-shaped fins 13. For example, preferably, the Vickers hardness of the substrate 11 is made greater than that of the pin-shaped fins 13 by about 20.

Preferably, an imaginary shape formed by connecting the projecting ends of all the convex portions 14 is a circle whose diameter is greater than the diameter of the fin insertion holes 12 of the substrate 11. Preferably, each of the fin insertion holes 12 has a diameter of 0.5 to 6 mm, and each of the pin-shaped fins 13 has a diameter of 0.3 to 5.99 mm as measured in a region where the convex portions 14 are not provided. Preferably, within these ranges, the diameter A (mm) of each fin insertion hole 12, the diameter B (mm) of each pin-shaped fin 13 at a portion where the convex portions 14 are not provided, and the diameter C (mm) of the imaginary circle connecting the projecting ends of all the convex portions 14 are determined such that relations $A-0.2 \leq B \leq A-0.01$ and $A+0.01 \leq C \leq A+0.2$ are satisfied. Also, preferably, the length of the convex portions 14 as measured in the longitudinal direction of the pin-shaped fins 13 is 0.5 to 5 mm.

Subsequently, all the pin-shaped fins 13 are inserted into the fin insertion holes 12 of the substrate 11 such that a portion of each pin-shaped fin 13 extending from one end thereof to the convex portions 14 passes through the corresponding fin insertion hole 12 (see FIG. 4). After that, while one end of each pin-shaped fin 13 is supported by an unillustrated die, the pin-shaped fin 13 is pressed by a punch toward the die from the other end so as to press-fit the pin-shaped fin 13 into the corresponding fin insertion hole 12. With this operation, of the convex portions 14 of each pin-shaped fin 13 and a portion of the substrate 11 around the corresponding fin insertion hole 12, at least the convex portions 14 are plastically deformed, whereby the pin-shaped fins 13 are provisionally fixed to the substrate 11 (see FIG. 5).

Alternatively, the pin-shaped fins 13 may be made harder than the substrate 11; for example, the Vickers hardness of the pin-shaped fins 13 may be made greater than that of the substrate 11 by about 20. In this case, when each pin-shaped fin 13 is press-fitted into the corresponding fin insertion hole 12, of the convex portions 14 of each pin-shaped fin 13 and a portion of the substrate 11 around the corresponding fin insertion hole 12, at least the portion of the substrate 11 around the corresponding fin insertion hole 12 is plastically deformed, whereby the pin-shaped fins 13 are provisionally fixed to the substrate 11.

After that, the substrate 11 and the pin-shaped fins 13 provisionally fixed to the substrate 11 are combined with the members constituting the casing 2, and the substrate 11 and the pin-shaped fins 13 are brazed together. Simultaneously with this, the opposite end portions of the pin-shaped fins 13 are brazed to portions of the members constituting the casing 2 which portions are to become the top wall 2a and the bottom wall 2b. Thus, the liquid-cooled-type cooling device 1 is manufactured.

Notably, in the case where the substrate 11 and the pin-shaped fins 13 is brazed together, preferably, the substrate 11 is formed from an aluminum brazing sheet having a brazing material layer on at least one of the opposite sides thereof. In the case where the opposite end portions of the pin-shaped fins 13 are brazed to the upper and lower constituent members 5 and 6 of the casing 2, preferably, each of the upper and lower constituent members 5 and 6 is formed from an aluminum brazing sheet having a brazing material layer on at least one of the opposite sides thereof such that the brazing material layer is located on the inner surface side. Also, the brazing between the opposite end portions of the pin-shaped fins 13 and the upper and lower constituent members 5 and 6 of the casing 2 may be performed through utilization of brazing material films disposed between the pin-shaped fins 13 and the upper and lower constituent members 5 and 6.

The inlet pipe 7 and the outlet pipe 8 may be brazed to the upper constituent member 5 simultaneously with the operation of brazing the substrate 11 and the pin-shaped fins 13 and brazing the pin-shaped fins 13 and the upper and lower constituent member 5 and 6. Alternatively, the inlet pipe 7 and the outlet pipe 8 may be joined to the upper constituent member 5 by a proper method after the operation of brazing the substrate 11 and the pin-shaped fins 13 and brazing the pin-shaped fins 13 and the upper and lower constituent member 5 and 6.

In the above-described embodiment, the upper and lower constituent member 5 and 6, the substrate 11 and the pin-shaped fins 13 are made of aluminum. However, these components may be made of copper (including copper alloy). The copper (including copper alloy) which constitutes the upper and lower constituent member 5 and 6, the substrate 11 and the pin-shaped fins 13 has a Vickers hardness of 50 to 300. In some cases, as in the above-described embodiment, the substrate 11 is made harder than the pin-shaped fins 13; for example, the Vickers hardness of the substrate 11 is made greater than that of the pin-shaped fins 13 by about 20. In some cases, the pin-shaped fins 13 is made harder than the substrate 11; for example, the Vickers hardness of the pin-shaped fins 13 is made greater than that of the substrate 11 by about 20.

FIGS. 6 to 9 show a first modification of the pin-shaped fins used for the radiating member of the liquid-cooled-type cooling device 1 shown in FIG. 1.

A pin-shaped fin 40 shown in FIGS. 6 to 9, excluding a longitudinally intermediate portion thereof, has a circular transverse cross section, and convex portions 41 and concave portions 42 are formed on a longitudinally intermediate portion of the peripheral surface of the pin-shaped fin 40 alternately and continuously in the circumferential direction such that the convex portions 41 project outward from the peripheral surface in the radial direction, and the concave portions 42 descend inward from the peripheral surface in the radial direction.

Preferably, the pin-shaped fin 40, excluding the portion where the convex portions 41 and the concave portions 42 are provided, has a circular transverse cross section having a diameter of 0.3 to 5.99 mm, and an imaginary shape formed by connecting the projecting ends of the plurality of the convex portions 41 is a circle having a diameter greater than the diameter of the fin insertion holes 12 of the substrate 11. Preferably, within these ranges, the diameter A (mm) of each fin insertion hole, the diameter B (mm) of the pin-shaped fin at a portion where the convex portions are not provided, and the diameter C (mm) of the imaginary circle connecting the projecting ends of all the convex portions are determined such that relations A−0.2≤B≤A−0.01 and A+0.01≤C≤A+0.2 are satisfied. Also, preferably, the length of the convex portions 41 as measured in the longitudinal direction of the pin-shaped fin 40 is 0.5 to 5 mm, and the depth of the concave portions 42 is 0.05 to 0.6 mm.

Although not shown in the drawings, the pin-shaped fin 40 is fabricated as follows. A longitudinally intermediate portion of the peripheral surface of a cylindrical columnar fin material is pressed by a single die from the radially outer side at a plurality of locations spaced from each other in the circumferential direction, whereby the plurality of concave portion 42 descending from the peripheral surface are formed at predetermined intervals in the circumferential direction. As a result of formation of the concave portion 42, the material flows whereby a convex portion 41 is formed between the adjacent concave portions 42.

As in the above-described embodiment, the upper and lower constituent member 5 and 6, the substrate 11, and the pin-shaped fin 40 are made of aluminum or copper (including copper alloy). The pin-shaped fin 40 and the substrate 11 have the same relation as in the above-described embodiment in terms of Vickers hardness. That is, the aluminum which constitutes the upper and lower constituent member 5 and 6, the substrate 11, and the pin-shaped fin 40 has a Vickers hardness of 10 to 250, and the copper (including copper alloy) which constitutes the upper and lower constituent member 5 and 6, the substrate 11, and the pin-shaped fin 40 has a Vickers hardness of 50 to 300. There exist a case where the substrate 11 is harder than the pin-shaped fin 40 and a case where the pin-shaped fin 40 is harder than the substrate 11. However, in ether case, preferably, the Vickers hardness of the harder component is made greater than that of the other softer component by about 20.

Figure 4:
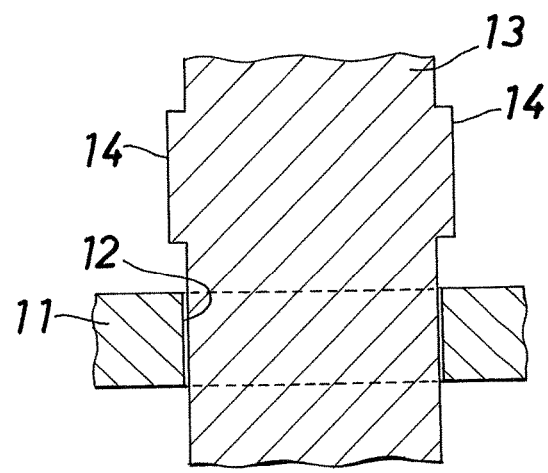
FIG. 4 is a vertical sectional view showing, on an enlarged scale, a state before a pin-shaped fin is press-fitted into a fin insertion hole of a substrate in a method of manufacturing the liquid-cooled-type cooling device of FIG. 1.
Figure 5:
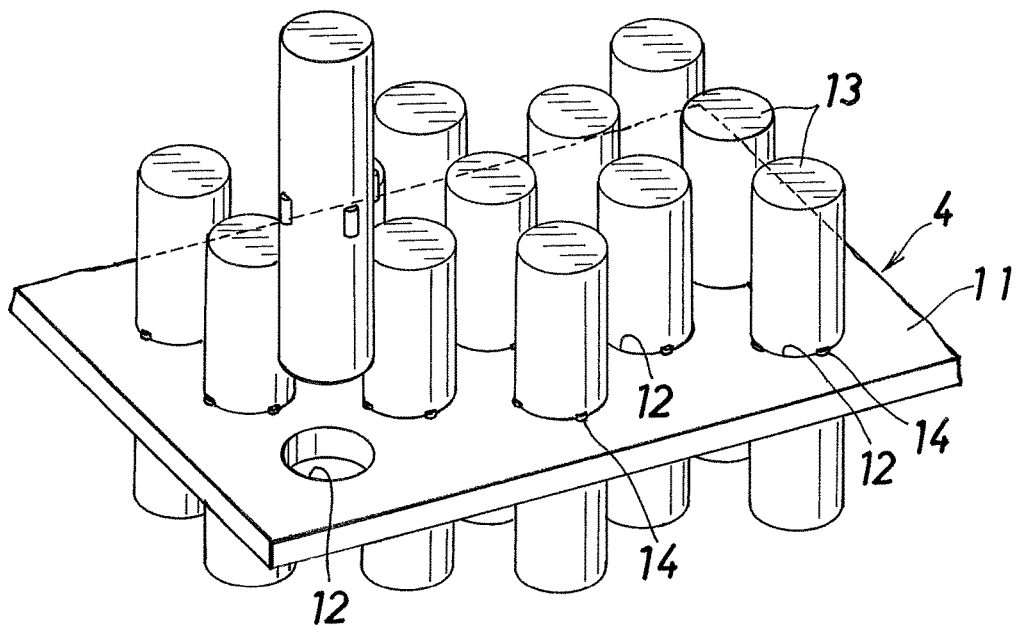
FIG. 5 is a vertical sectional view showing, on an enlarged scale, a state after pin-shaped fins have been press-fitted into fin insertion holes of the substrate in the method of manufacturing the liquid-cooled-type cooling device of FIG. 1.
Figure 6:
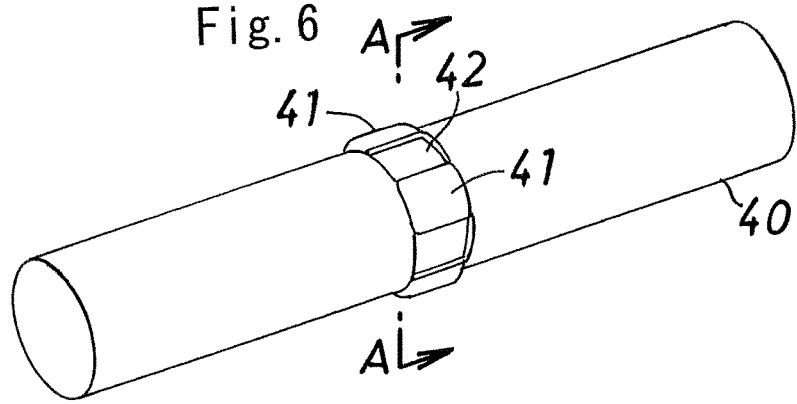
FIG. 6 is a perspective view showing a first modification of the pin-shaped fin used for manufacturing the liquid-cooled-type cooling device of FIG. 1.
Figure 7:
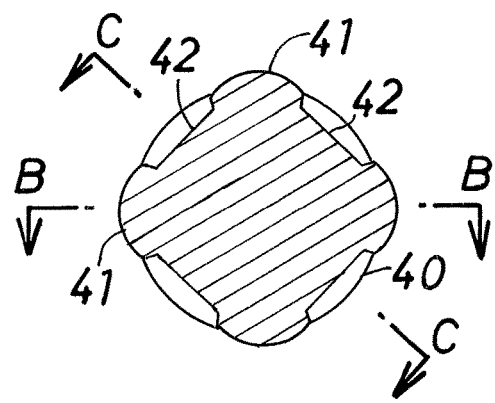
FIG. 7 is an enlarged sectional view taken along line A-A of FIG. 6.
Figure 8:
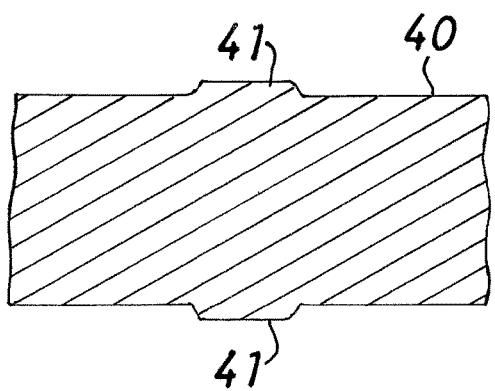
FIG. 8 is a sectional view taken along line B-B of FIG. 7.
Figure 9:
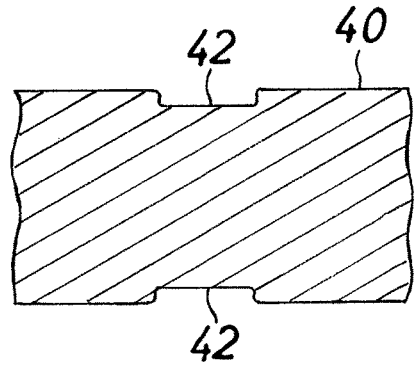
FIG. 9 is a sectional view taken along line C-C of FIG. 7.

A method of manufacturing the liquid-cooled-type cooling device 1 using the pin-shaped fin 40 shown in FIGS. 6 to 9 is the same as that shown in FIGS. 4 and 5.

Figure 10:
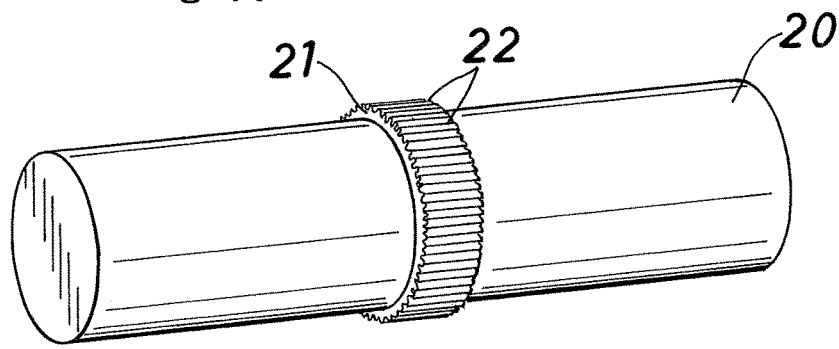
FIG. 10 is a perspective view showing a second modification of the pin-shaped fin used for manufacturing the liquid-cooled-type cooling device of FIG. 1.

FIG. 10 shows a second modification of the pin-shaped fins used for the radiating member of the liquid-cooled-type cooling device 1 shown in FIG. 1.

A pin-shaped fin 20 shown in FIG. 10 has the shape of a circular column having a circular transverse cross section. An annular protrusion 21 is integrally formed at a longitudinally intermediate portion of the peripheral surface of the pin-shaped fin 20. The annular protrusion 21 has a predetermined width in the longitudinal direction of the pin-shaped fin 20. A plurality of convex portions 22 are integrally formed on the peripheral surface of the annular protrusion 21 such that the convex portions 22 are arranged successively in the circumferential direction. The convex portions 22 project outward from the peripheral surface and extend in the longitudinal direction of the pin-shaped fin 20. Preferably, an imaginary shape formed by connecting the projecting ends of all the convex portions 22 is a circle having a diameter greater than the diameter of the fin insertion holes 12 of the substrate 11. Preferably, each of the fin insertion holes 12 has a diameter of 0.5 to 6 mm, and the pin-shaped fin 20 has a diameter of 0.3 to 5.99 mm as measured in a region where the convex portions 22 are not provided. Preferably, within these ranges, the diameter A (mm) of each fin insertion hole 12, the diameter B (mm) of each pin-shaped fin 20 at a portion where the convex portions 22 are not provided, and the diameter C (mm) of the imaginary circle connecting the projecting ends of all the convex portions 22 are determined such that relations A−0.2≤B≤A−0.01 and A+0.01≤C≤A+0.2 are satisfied. Also, preferably, the length of the convex portions 22 as measured in the longitudinal direction of the pin-shaped fin 20 is 0.5 to 5 mm.

As in the above-described embodiment, the upper and lower constituent member 5 and 6, the substrate 11, and the pin-shaped fin 20 are made of aluminum or copper (including copper alloy). The pin-shaped fin 20 and the substrate 11 have the same relation as in the above-described embodiment in terms of Vickers hardness.

A method of manufacturing the liquid-cooled-type cooling device 1 using the pin-shaped fin 20 shown in FIG. 10 is the same as that shown in FIGS. 4 and 5.

Figure 11:
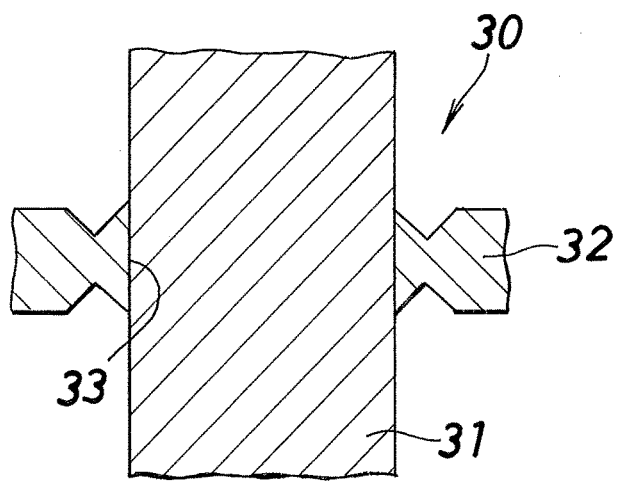
FIG. 11 is a view corresponding to FIG. 2 and showing a modification of a radiating member used in the liquid-cooled-type cooling device of FIG. 1.

FIG. 11 shows a modification of the radiating member used in the liquid-cooled-type cooling device 1 shown in FIG. 1.

As shown in FIG. 11, an aluminum pin-shaped fin 31 of a radiating member 30 has the shape of a circular column having a circular transverse cross section, and has a constant diameter over the entire length. The pin-shaped fin 31 is inserted into a fin insertion hole 33 of a substrate 32, and a portion of the substrate 32 around the fin insertion hole 33 is pressed from the opposite sides of the substrate 32, whereby that portion plastically deforms over the entire circumference of the fin insertion hole 33. Thus, the pin-shaped fins 31 are provisionally fixed to the substrate 32. In such a state, the substrate 32 and the pin-shaped fins 31 are brazed together. Also, the upper and lower end portions of the pin-shaped fin 31 are brazed to the top wall 2a and the bottom wall 2b, respectively, of the casing 2.

The structure of the remaining portion is the same as that of the radiating member 4 of the liquid-cooled-type cooling device 1 shown in FIGS. 1 and 2.

Figure 12:
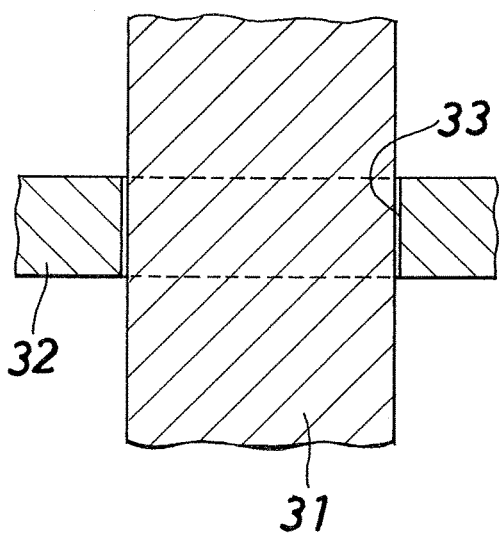
FIG. 12 is a vertical sectional view showing, on an enlarged scale, a state before a pin-shaped fin is press-fitted into a fin insertion hole of a substrate in a method of manufacturing a liquid-cooled-type cooling device with the radiating member of FIG. 11.

Next, a method of manufacturing the liquid-cooled-type cooling device 1 including the radiating member 30 shown in FIG. 11 will be described with reference to FIG. 12.

First, the upper and lower constituent members 5 and 6 of the casing 2, and the substrate 32 and the plurality of pin-shaped fins 31 of the radiating member 4 are prepared. Preferably, the diameter D (mm) of the fin insertion holes 33 and the diameter E (mm) of the pin-shaped fins 31 satisfy a relation D−0.2≤E≤D−0.01.

Subsequently, after all the pin-shaped fins 31 have been inserted into the fin insertion holes 33 of the substrate 32 from their lower ends, one surface of the substrate 32 is supported by an unillustrated die having holes for partially receiving the pin-shaped fins 31. The die has upward projecting annular projections provided at positions corresponding to the fin insertion holes 33 of the substrate 32. Subsequently, portions of the other surface of the substrate 32 around the fin insertion holes 33 are pressed toward the die through use of a punch which has annular projections, whereby the opposite surfaces of the substrate 32 are pressed inward around the fin insertion holes 33. As a result, portions of the substrate 32 around the fin insertion holes 33 are elastically deformed, whereby the pin-shaped fins 31 are provisionally fixed to the substrate 32.

After that, the substrate 32 and the pin-shaped fins 31 provisionally fixed to the substrate 32 are combined with the members constituting the casing 2, and the substrate 32 and the pin-shaped fins 31 are brazed together, and, simultaneously, the opposite end portions of the pin-shaped fins 31 are brazed to portions of the members constituting the casing 2 which portions will become the top wall 2*a* and the bottom wall 2*b*. Thus, the liquid-cooled-type cooling device 1 is manufactured.

Figure 3:
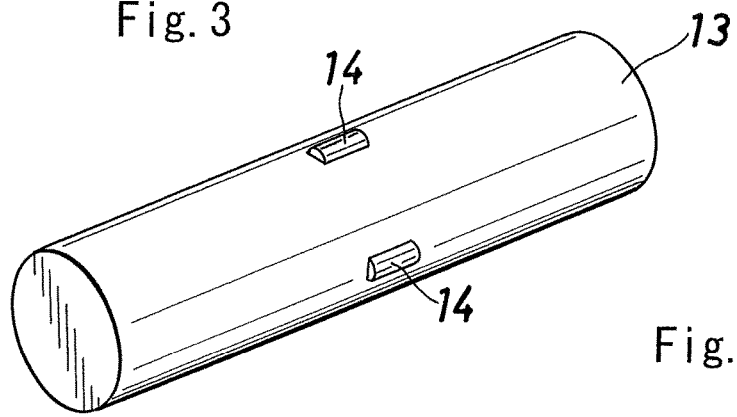
FIG. 3 is a perspective view showing a pin-shaped fin used for manufacturing the liquid-cooled-type cooling device of FIG. 1.

Notably, the brazing between the substrate 32 and the pin-shaped fins 31 and the brazing between the opposite end portions of the pin-shaped fins 31 and the upper and lower constituent members 5 and 6 of the casing 2 are performed in the same manner as that shown in FIGS. 3 to 5. Further, the joining of the inlet pipe 7 and the outlet pipe 8 to the upper constituent member is also performed in the same manner as that shown in FIGS. 3 to 5.

Although the above-described pin-shaped fins 13, 40, 20, 31 have the shape of a circular column having a circular transverse cross section, the shape of the pin-shaped fins is not limited thereto, and the transverse cross sectional shape of the pin-shaped fins may be a polygon (e.g., triangle, rectangle), an ellipse, or the like. Also, in addition to the fin insertion holes 12, 33, through which the pin-shaped fins 13, 20, 31 are inserted, cooling-liquid flow channels may be formed in the substrate 11, 32 of the radiating member 4, 30 so as to mix the cooling liquid present above the substrate 11, 32 within the casing 2 and the cooling liquid present below the substrate 11, 32, to thereby improve the cooling performance.

The liquid-cooled-type cooling device of the present invention is suitably used to cool a power device such as IGBT, which is used in a power conversion apparatus mounted on an electric vehicle, a hybrid vehicle, an electric railcar, or the like.

What is claimed is:

1. A liquid-cooled-type cooling device comprising:
   a casing which has a top wall and a bottom wall opposite to the top wall in a height direction of the liquid-cooled-type cooling device and in which a cooling-liquid passage is provided; and
   a radiating member disposed in the cooling-liquid passage within the casing, comprising:
      a substrate provided between the top wall and the bottom wall separately from the top wall and the bottom wall in the casing and having fin insertion holes which pass through the substrate in the height direction and each of which has an inner wall to define each of the fin insertion holes; and
      pin-shaped fins each of which has an upper end portion and a lower end portion opposite to the upper end portion in the height direction and which are inserted into the fin insertion holes, respectively, to pass through the substrate such that both of the upper end portion and the lower end portion project from the substrate in the height direction, each of the pin-shaped fins having at least one convex portion opposite to each of the fin insertion holes, the at least one convex portion being provided between the upper end portion and the lower end portion on an outer peripheral surface of each of the pin-shaped fins to project from the outer peripheral surface such that at least one of the inner wall and the at least one convex portion deforms to connect the pin-shaped fins to the substrate, the pin-shaped fins and the substrate being brazed together, the upper end portion and the lower end portion which project from the substrate in the height direction being brazed to the top wall and bottom wall, respectively.

2. The liquid-cooled-type cooling device according to claim 1, wherein
   the substrate has a Vickers hardness that is greater than the pin-shaped fins and the plurality of convex portions; and
   of the plurality of convex portions and the portions of the substrate around the fin insertion holes, at least the plurality of convex portions have deformed portions.

3. The liquid-cooled-type cooling device according to claim 1, wherein
   the pin-shaped fins and the plurality of convex portions have a Vickers hardness that is greater than the substrate; and
   of the plurality of convex portions and the portions of the substrate around the fin insertion holes, at least the portions of the substrate around the fin insertion holes have deformed portions.

4. The liquid-cooled-type cooling device according to claim 2, wherein
   a portion of each pin-shaped fin where the convex portion is not provided has a circular transverse cross section; and
   convex portions and concave portions are formed on the longitudinally intermediate portion of each pin-shaped fin alternately and continuously in the circumferential direction such that the convex portions project radially outward from the peripheral surface of the intermediate portion, and the concave portions descend radially inward from the peripheral surface of the intermediate portion.

5. A liquid-cooled-type cooling device according to claim 4, wherein the fin insertion holes of the substrate are circular and have a diameter of 0.5 to 6 mm; a portion of each pin-shaped fin where neither the convex portions nor the concave portions are provided has a diameter of 0.3 to 5.99 mm; and the concave portions have a depth of 0.05 to 0.6 mm.

6. The liquid-cooled-type cooling device according to claim 3, wherein
   a portion of each pin-shaped fin where the convex portion is not provided has a circular transverse cross section; and
   convex portions and concave portions are formed on the longitudinally intermediate portion of each pin-shaped fin alternately and continuously in the circumferential direction such that the convex portions project radially outward from the peripheral surface of the intermediate portion, and the concave portions descend radially inward from the peripheral surface of the intermediate portion.

7. The liquid-cooled-type cooling device according to claim 6, wherein
   the fin insertion holes of the substrate are circular and have a diameter of 0.5 to 6 mm;
   a portion of each pin-shaped fin where neither the convex portions nor the concave portions are provided has a diameter of 0.3 to 5.99 mm; and
   the concave portions have a depth of 0.05 to 0.6 mm.

* * * * *